United States Patent [19]

Krauss

[11] 4,114,118
[45] Sep. 12, 1978

[54] ELECTROMECHANICAL FILTER HAVING ENCAPSULATED INPUT AND TERMINAL CIRCUIT CAPACITORS

[75] Inventor: Güenter Krauss, Neuried, Germany

[73] Assignee: Siemens Aktiengesellschaft, Berlin & Munich, Germany

[21] Appl. No.: 741,848

[22] Filed: Nov. 15, 1976

[30] Foreign Application Priority Data

Nov. 28, 1975 [DE] Fed. Rep. of Germany ....... 2553709

[51] Int. Cl.² .......................... H03H 7/10; H03H 7/30
[52] U.S. Cl. ........................................ 333/71; 333/72; 333/30 R
[58] Field of Search .......................... 333/30 R, 71, 72

[56] References Cited

U.S. PATENT DOCUMENTS

| | | | |
|---|---|---|---|
| 2,656,516 | 10/1953 | Doelz | 333/71 |
| 2,799,832 | 7/1957 | Niederman et al. | 333/71 |
| 2,829,350 | 4/1958 | Ibsen | 333/71 |
| 3,931,600 | 1/1976 | Nagashima | 333/71 |

FOREIGN PATENT DOCUMENTS 1,922,551  1/1971  Fed. Rep. of Germany.

Primary Examiner—Alfred E. Smith
Assistant Examiner—Harry E. Barlow
Attorney, Agent, or Firm—Hill, Gross, Simpson, Van Santen, Steadman, Chiara & Simpson

[57] ABSTRACT

An electromechanical filter has a plurality of mechanically coupled mechanical resonators disposed parallel to each other, in particular resonators of the flexural vibration type. The first and last resonators in the direction of transmission are each provided with an electrostrictive transducer element which has a feeder which is constituted, in particular, by an insulating bushing provided in a metallic base plate and is connected with an electrical input or terminal circuit, respectively, constructed as an LC resonant circuit. The capacitor of the input circuit or the terminal circuit is disposed within a trough-shaped recess in the base plate beneath the filter and the capacitors are encapsulated within an insulating material to provide a capacitor unit which fits into the recess in releasable engagement therewith.

10 Claims, 7 Drawing Figures

ELECTROMECHANICAL FILTER HAVING ENCAPSULATED INPUT AND TERMINAL CIRCUIT CAPACITORS

BACKGROUND OF THE INVENTION

1. Field of the Invention

The present invention relates to an electromechanical filter having a plurality of mechanically coupled mechanical resonators disposed in parallel with one another, in particular resonators of the flexural vibration type, wherein the first and the last resonators in the direction of transmission are each provided with an electrostrictive transducer element which has a feeder constituted by an insulating bushing mounted in a metallic base plate, and is connected to an electrical input circuit or terminal circuit, respectively, constructed as an LC resonant circuit, the capacitor of the input circuit and of the terminal circuit being disposed within a trough-shaped recess in the base plate beneath the filter.

2. Description of the Prior Art

Electromechanical filters have assumed great practical importance in resolving many problems which arise in filter technology among other things insofar as such filters are known to be superior in some respects to filters constructed from concentrated circuit elements, both with respect to the space required and with respect to their electrical properties, above all the quality of their resonance elements. Electromechanical filters, in particular those having flexural resonators as resonance elements and coupling elements describing longitudinal vibrations, such as are known for example from the German Pat. No. 1,922,550, have proved highly suitable for use in miniaturized circuits in which the filters also must be as small as possible in volume.

With such mechanical filters, the input and output circuits are constructed as electrical, i.e. LC resonant circuits. Here, the resonant circuit coils, for example on the long sides of the filter cover, and the resonant circuit capacitors are housed most favorably in a trough-shaped recess in the base plate beneath the filter, in particular by virtue of the compact and small filter configuration. This configuration has proved valuable in itself. However, for this configuration, the connecting wires at both capacitors must be manually formed, cut and soldered to a groove in the base plate and to the bushing of the transducer elements.

Because of the cramped conditions, this assembling of the capacitors proves to be relatively difficult and poses problems for automation, particularly when the tolerances for the external dimensions of the capacitors employed are large or when differing capacitors are employed.

SUMMARY OF THE INVENTION

The primary object of the invention is to provide a configuration for an electromechanical filter through which the above-named difficulties are overcome and, in particular, the assembly of the resonant circuit capacitors can be largely automated.

Beginning with an electromechanical filter having a plurality of mechanically coupled mechanical resonators disposed parallel to one another, in particular resonators of the flexural vibration type, wherein the first and the last resonators in the direction of transmission is provided, in each case, with an electrostrictive transducer element, the feeder of which is constituted in particular by an insulating bushing disposed in the metal base plate and is connected with an electrical input or terminal circuit in the form of an LC resonant circuit, and wherein the capacitor of the input and terminal circuits are disposed, in each case, within a trough-shaped recess in the base plate beneath the filter, the above objective is achieved, according to the present invention, in that both capacitors are encapsulated together within an insulating material to provide a capacitor unit which fits into the recess in the base plate and which is releasably engageable with the base plate.

One advantage of the invention is derived from the fact that even when capacitors are used having large tolerances for their external dimensions, their connections are maintained accurately within a predetermined raster and, moreover, from the fact that any danger of shorting between the connecting wires and the metal base plate is eliminated by having the connecting wires embedded in the capacitor unit.

A particular advantage with regard to the assembly of the filter derives from the fact that the soldered connection between the base plate and one capacitor connection can be omitted since, in accordance with the invention, the capacitors can be connected electrically to the mechanical part of the filter by conductor paths and by wave-soldering the filter on a corresponding conductor base plate.

With the high packing density entailed in the desired level of miniaturization, generally the state of the art makes it necessary to insulate the connecting wires to avoid short circuits, but this can be omitted with the present invention.

Further advantages can be seen in the ease of handling when changing the capacitors in the form of a sealed capacitor unit and in the excellent protection which is provided against mechanical damage. The encapsulation in plastic also offers effective protection against shunting, for example as a result of contamination.

It is advantageous to provide the capacitor unit with at least one hook-shaped projection which engages in a corresponding aperture in the base plate and thereby ensures secure, but detachable, anchorage of the capacitor unit within the recess in the base plate.

For production of the capacitor unit using an injection molding process, it is advantageous to employ an injectable thermoplastic as an insulating material.

BRIEF DESCRIPTION OF THE DRAWING

Other objects, features and advantages of the invention, its organization, construction and operation will be best understood from the following detailed description taken in conjunction with the accompanying drawing, on which.

DESCRIPTION OF THE PREFERRED EMBODIMENTS

Figure 1:
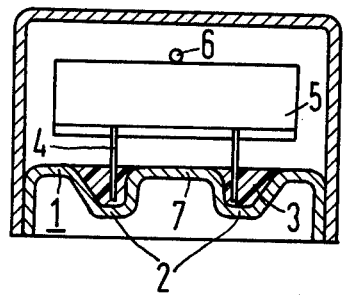
FIG. 1 is a cross-sectional view of an electromechanical filter.

A mechanical filter is illustrated in FIG. 1 as comprising a carrier in the form of a metal base plate 1 which is provided, on the side facing a plurality of resonators 5, with two groove-shaped channels 2 which are formed such that a casting compound 3 can be contained therein even when in the liquid state.

In order to hold the resonator system, relatively short pins 4 made of metal are provided which are attached to the nodes of the resonators 5 and held in the groove-shaped channels 2 by the solidified casting compound. The separate resonators are interconnected by means of wire-shaped coupling elements 6.

Between the two groove-shaped channels 2, the base plate is provided on its underside facing away from the resonators, with a trough-shaped recess 7 which serves to receive the resonant circuit capacitors.

Figure 2:
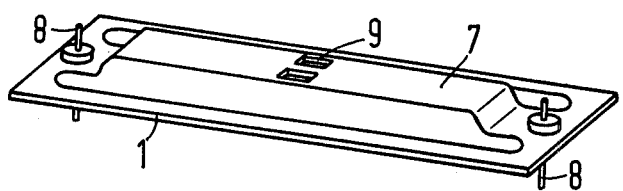
FIG. 2 illustrates a base plate for the electromechanical filter of the present invention.

Referring to FIG. 2, a base plate 1 is illustrated as having two insulated bushings 8 which, when the filter is fully assembled, are linked on the resonator side with the transducer elements of the first or the last resonator, respectively, and on the underneath side of the filter with one terminal of a respective resonant circuit capacitor by means of a conductive base plate. The bottom of the trough-shaped recess 7 is provided with two spaced apart apertures 9 which form part of a releasable engagement structure with the capacitor unit illustrated in FIG. 3.

Figure 3:
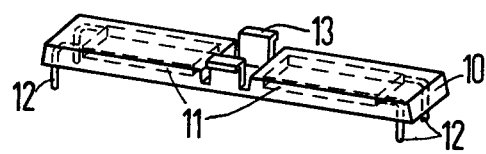
FIG. 3 illustrates a capacitor unit constructed in accordance with the invention.

In FIG. 3, a rod-shaped capacitor unit 10, which fits into the trough-shaped recess 7 in the base plate 1 in a releasable engagement manner, is illustrated separate from the base plate 1. The resonant circuit capacitors 11 are enclosed in the capacitor unit 10 and are illustrated by broken lines and include connecting wires 12 which are turned downwardly. On the side facing the bottom of the trough-shaped recess, the capacitor unit 10 is provided with two hook-shaped projections 13 which are engageable in the apertures 9 in the base plate for anchorage to the base plate 1 and also to ensure the connecting wires are centered relative to the bushings 8.

An eminently suitable injectable insulating material for production of the capacitor unit is polystyrene, for example acrylnitrile-butadiene-styrene copolymer; ABS.

In addition to injectable thermoplastics, such as Novodur PM/AT or Terulan 877T for example, duroplastics suitable for low-pressure forming can also be employed as the insulating material for the capacitor unit 10.

Figure 4:
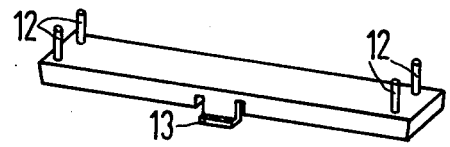
FIG. 4 is a perspective view of the capacitor unit of FIG. 3 flipped upside down.

In FIG. 4, the capacitor unit 10 is illustrated with an opposite orientation to that of FIG. 3, that is with the terminal wires pointing upwardly. If the capacitor unit is produced using a suitable tool, it is possible, even when the tolerances for the external dimensions of the capacitors are large, to keep their connecting wires accurately in a predetermined raster defined by a channel converter board, for example.

The capacitors are electrically connected to the mechanical part of the filter, for example when the filter is used in conjunction with a channel converter, by means of conductor paths on the channel converter board and by wave soldering the filter on the channel converter board.

The insulating bushing 8 referred to above constitutes a through connection of a pin through the base plate 1 so that the pin is insulated therefrom. The pin is the actual electrical connecting element which is electrically connected on the one hand to an appertaining resonator and on the other hand to a resonant circuit capacitor by way of a conductive base plate, as may be accomplished by wave soldering the filter on the channel converter board.

Figure 5:
FIGS. 5–7 illustrate examples of ceramic capacitors which are suitable for the capacitor unit illustrated in FIGS. 3 and 4.
Figure 6:
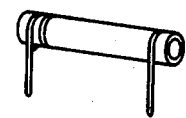
Figure 7:

In FIGS. 5-7, various forms of ceramic capacitors suitable for encapsulation in plastic for the capacitor unit are illustrated.

FIG. 5, for example, illustrates a ceramic capacitor having the form of a small insulating dielectric plate which carries a metallic coating on each side thereof as the capacitor plates.

FIG. 6 illustrates a cermic capacitor in the form of an insulating round tube having a metallic coating on the inner side and a metallic coating on the outer side.

FIG. 7 illustrates another suitable ceramic capacitor made in the shape of a hollow tube having a rectangular cross-section, which tube carries a metal coating on the inner surface and a metal coating on the outer surface as the capacitor plates.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an electromechanical filter of the type having a metallic base plate, a plurality of mechanically coupled mechanical resonators disposed parallel to each other on the base plate, a pair of electrostrictive transducer elements each associated with a respective end mechanical resonator of the plurality of resonators and having a feeder which is constituted by an insulating bushing disposed on the base plate and a terminal extending through the insulator and connected to a respective electric LC input or output circuit each of which includes a respective capacitor, the improvement therein wherein:
    said metallic base plate includes a trough-shaped recess in the area below the resonators; and
    said capacitors are jointly encapsulated with insulation material into a capacitor unit, said capacitor unit shaped to conform to the shape of the recess in the metallic base plate and form-locked mounted therein.

2. The improved filter of claim 1, wherein said capacitors and said electrostrictive transducers are electrically connected to a circuit board.

3. The improved filter of claim 1, wherein:
    said base plate includes means defining at least one aperture therein; and
    said capacitance unit includes at least one hook-shaped projection to be received in said aperture and engage said base plate.

4. The improved filter of claim 1, wherein said insulating material comprises an injectable thermoplastic material.

5. The improved filter of claim 1, wherein said insulating material comprises a duroplastic material suitable for low-pressure forming.

6. The improved filter of claim 1, wherein each capacitor is a ceramic capacitor which comprises a dielectric plate and a pair of metallic coatings on respective sides of said plate.

7. The improved filter of claim 1, wherein each capacitor is a ceramic capacitor which comprises an insulating tube having outer and inner surfaces and a pair of metallic coatings on respective ones of said surfaces.

8. The improved filter of claim 7, wherein said tube is a rectangular tube.

9. The improved filter of claim 1, wherein:

said capacitance unit comprises a pair of hooks projecting therefrom; and said base plate includes means defining a pair of apertures for receiving said hooks to lock said unit to said base plate.

10. The improved filter of claim 9, wherein said hooks are resilient hooks for flexible engagement with and disengagement from said base plate.

* * * * *